(12) United States Patent
Yu et al.

(10) Patent No.: US 9,576,926 B2
(45) Date of Patent: Feb. 21, 2017

(54) PAD STRUCTURE DESIGN IN FAN-OUT PACKAGE

(71) Applicant: Taiwan Semiconductor Manufacturing Company, Ltd., Hsin-Chu (TW)

(72) Inventors: Chen-Hua Yu, Hsin-Chu (TW); Shin-Puu Jeng, Hsin-Chu (TW); Der-Chyang Yeh, Hsin-Chu (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 186 days.

(21) Appl. No.: 14/157,054

(22) Filed: Jan. 16, 2014

(65) Prior Publication Data

US 2015/0200185 A1    Jul. 16, 2015

(51) Int. Cl.
*H01L 23/48* (2006.01)
*H01L 23/00* (2006.01)
*H01L 23/538* (2006.01)
*H01L 25/10* (2006.01)
*H01L 23/498* (2006.01)

(52) U.S. Cl.
CPC ........ *H01L 24/17* (2013.01); *H01L 23/49811* (2013.01); *H01L 23/49838* (2013.01); *H01L 23/5389* (2013.01); *H01L 25/105* (2013.01); *H01L 24/13* (2013.01); *H01L 24/16* (2013.01); *H01L 24/48* (2013.01); *H01L 2224/0401* (2013.01); *H01L 2224/05552* (2013.01); *H01L 2224/05555* (2013.01); *H01L 2224/06051* (2013.01); *H01L 2224/06135* (2013.01); *H01L 2224/06136* (2013.01); *H01L 2224/06179* (2013.01); *H01L 2224/13147* (2013.01); *H01L 2224/16052* (2013.01); *H01L 2224/16055* (2013.01); *H01L 2224/16227* (2013.01); *H01L 2224/17051* (2013.01); *H01L 2224/17135* (2013.01); *H01L 2224/17136* (2013.01); *H01L 2224/17179* (2013.01); *H01L 2224/48227* (2013.01); *H01L 2224/73253* (2013.01); *H01L 2224/73265* (2013.01); *H01L 2225/1035* (2013.01); *H01L 2225/1058* (2013.01);
(Continued)

(58) Field of Classification Search
CPC ................. H01L 25/065; H01L 23/00; H01L 2924/01079; H01L 2224/13099
See application file for complete search history.

(56) References Cited

U.S. PATENT DOCUMENTS

2003/0218243 A1* 11/2003 Chen ................. H01L 23/49816
257/734
2004/0080043 A1*  4/2004 Tsai .................. H01L 23/49816
257/723

(Continued)

*Primary Examiner* — Daniel Luke
*Assistant Examiner* — Khatib Rahman
(74) *Attorney, Agent, or Firm* — Slater Matsil, LLP

(57) ABSTRACT

A package includes a corner, a device die, a plurality of redistribution lines underlying the device die, and a plurality of non-solder electrical connectors underlying and electrically coupled to the plurality of redistribution lines. The plurality of non-solder electrical connectors includes a corner electrical connector. The corner electrical connector is elongated. An electrical connector is farther away from the corner than the corner electrical connector, wherein the electrical connector is non-elongated.

20 Claims, 9 Drawing Sheets

(52) U.S. Cl.
CPC ............ *H01L 2924/15311* (2013.01); *H01L 2924/181* (2013.01); *H01L 2924/351* (2013.01)

(56) References Cited

U.S. PATENT DOCUMENTS

| | | | | |
|---|---|---|---|---|
| 2005/0062151 | A1* | 3/2005 | Nagao | H01L 23/49816 257/734 |
| 2007/0152350 | A1* | 7/2007 | Kim | H01L 23/3128 257/786 |
| 2011/0006422 | A1* | 1/2011 | Daubenspeck | H01L 24/11 257/738 |
| 2012/0098120 | A1* | 4/2012 | Yu | H01L 24/13 257/737 |
| 2012/0273960 | A1* | 11/2012 | Park | H01L 21/4846 257/774 |
| 2013/0270700 | A1* | 10/2013 | Yu | H01L 23/498 257/738 |

* cited by examiner

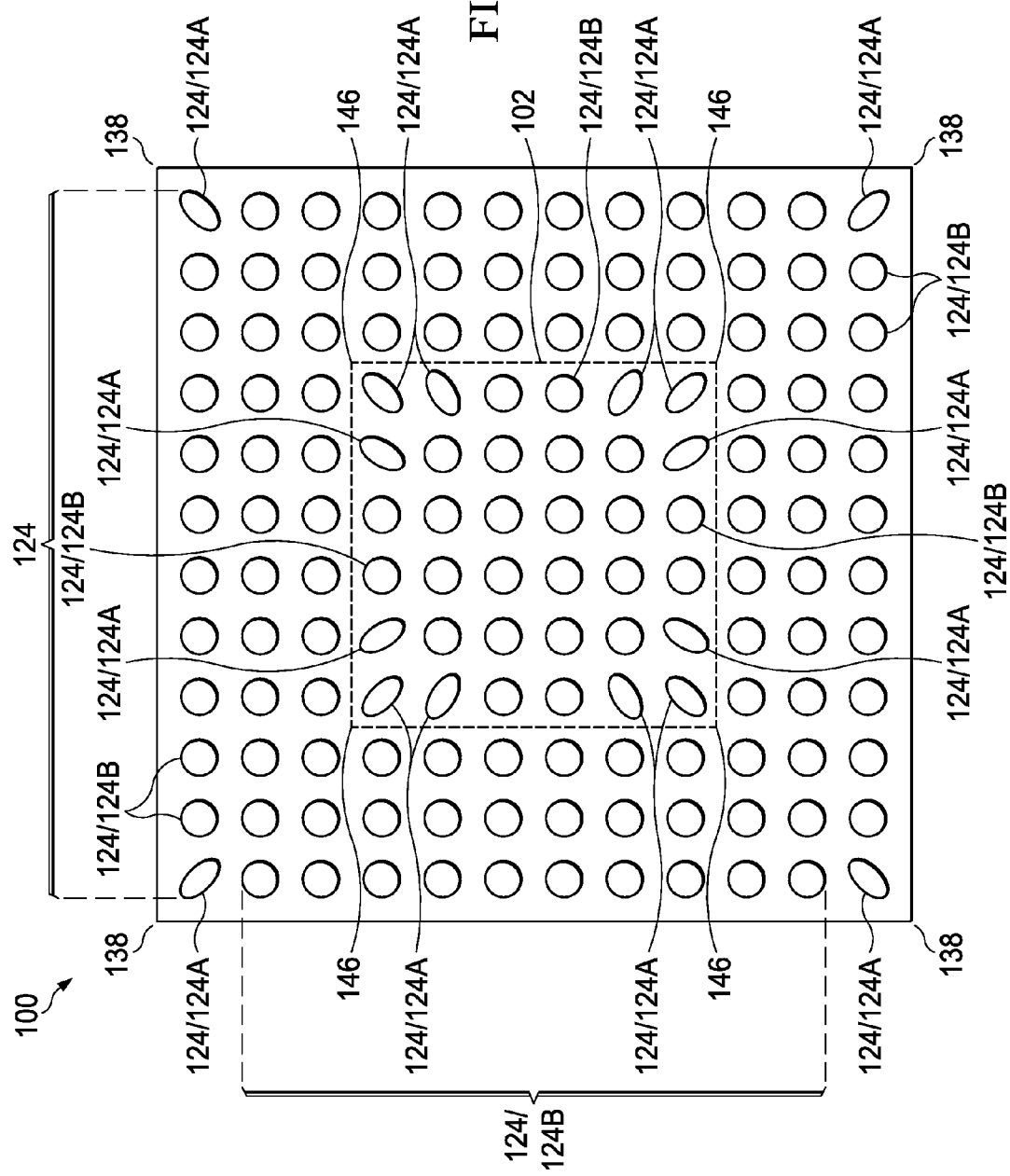

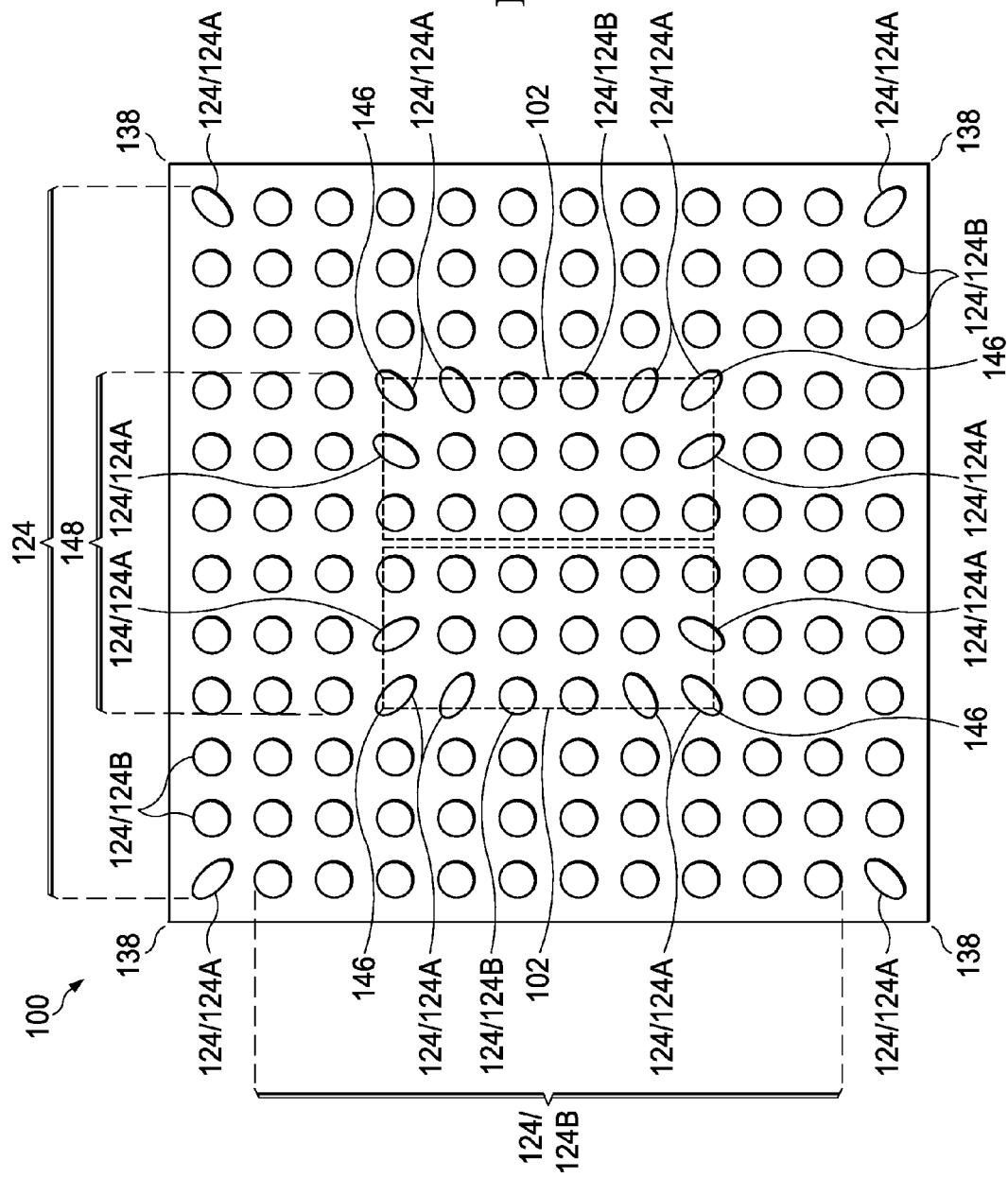

PAD STRUCTURE DESIGN IN FAN-OUT PACKAGE

BACKGROUND

In the packaging of integrated circuits, there are various types of packaging methods and structures. For example, in a conventional Package-on-Package (POP) process, a top package is bonded to a bottom package. The top package and the bottom package may also have device dies packaged therein. By adopting the PoP process, the integration level of the packages is increased.

In an existing PoP process, the bottom package is formed first, which includes a device die bonded to a package substrate. A molding compound is then molded on the package substrate, wherein the device die is molded in the molding compound. The package substrate further includes solder balls formed thereon, wherein the solder balls and the device die are on a same side of the package substrate. The solder balls are used for connecting the top package to the bottom package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 illustrates a bottom view of a package and non-solder electrical connectors of the package in accordance with some embodiments, wherein a plurality of inner electrical connectors adjacent to each corner of an overlying device die is elongated;

FIG. 8 illustrates a bottom view of a package and non-solder electrical connectors of the package in accordance with some embodiments, wherein a plurality of inner electrical connectors adjacent to each corner of an overlying device die group is elongated;

DETAILED DESCRIPTION

Figure 1:
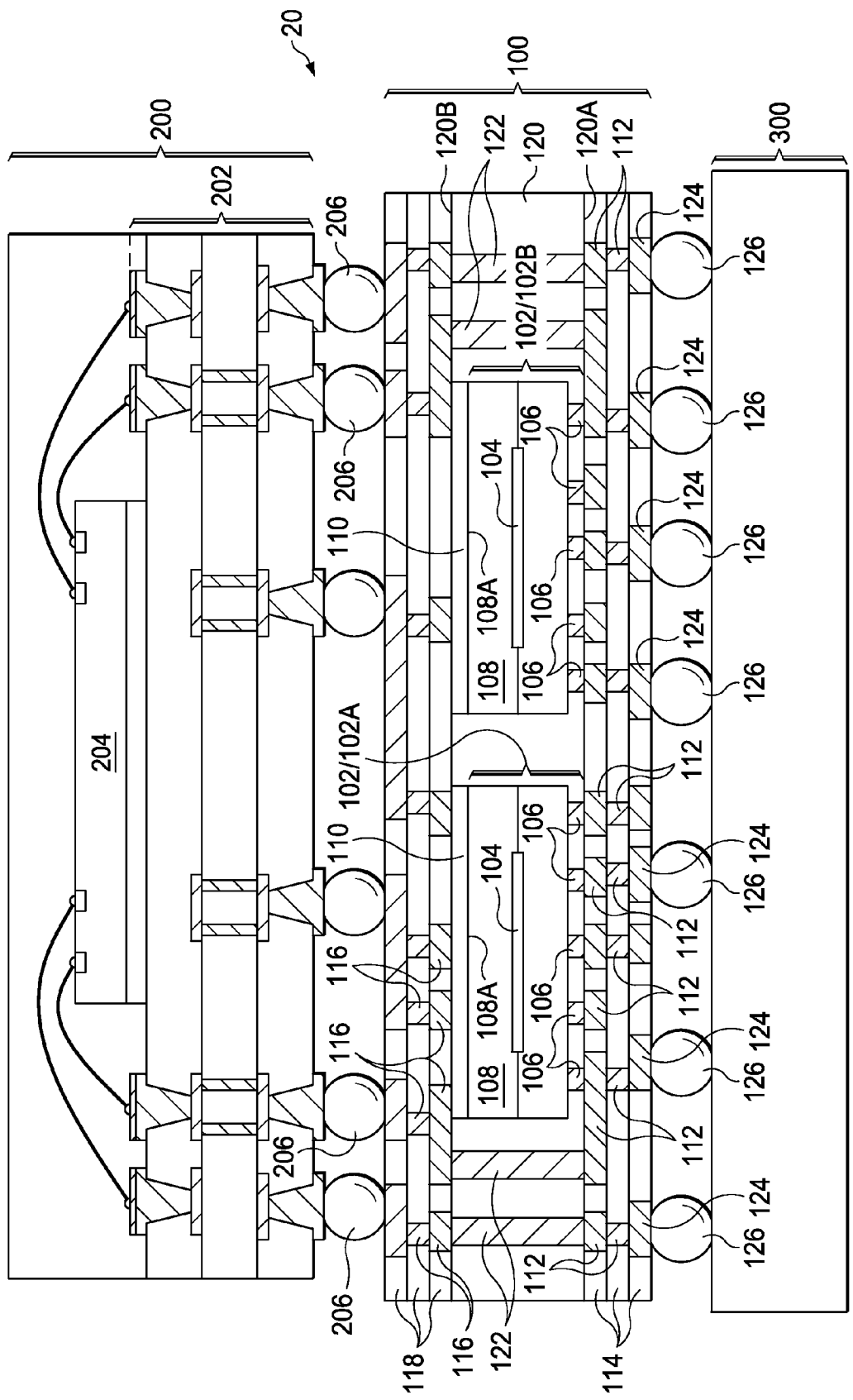
FIG. 1 illustrates a cross-sectional view of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "under," "lower," "over," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A fan-out package is provided in accordance with various exemplary embodiments. The variations of the embodiments are discussed. Throughout the various views and illustrative embodiments, like reference numbers are used to designate like elements.

FIG. 1 illustrates a cross-sectional view of package 20 in accordance with some embodiments. Package 20 includes bottom package 100, and top package 200 over and bonded to bottom package 100. In some embodiments, bottom package 100 includes device dies 102 (including 102A and 102B), with the front sides of device dies 102 facing down and bonded to Redistribution Lines (RDLs) 112. In alternative embodiments, bottom package 100 includes a single device die or more than two device dies. Device dies 102 may include semiconductor substrates 108, and integrated circuit devices (such as active devices, which include transistors, for example) 104 at the front surface (the surface facing down) of semiconductor substrate 108. Device dies 102 may include logic dies such as Central Processing Unit (CPU) dies, Graphic Processing Unit (GPU) dies, mobile application dies, or the like.

Device dies 102 are molded in molding material 120, which surrounds device dies 102. Molding material 120 may be a molding compound, a molding underfill, a resin, or the like. The bottom surface 120A of molding material 120 may be leveled with the bottom ends of device dies 102. The top surface 120B of molding material 120 may be level with or higher than back surface 108A of semiconductor substrate 108. In some embodiments, back surfaces 108A of semiconductor substrates 108 are overlapped by dielectric films 110, which adhere device dies 102 to the overlying dielectric layer 118 and RDLs 116. Device dies 102 further includes metal pillars 106 (which may include copper pillars) in contact with, and bonded to, RDLs 112.

Bottom package 100 may include bottom-side RDLs 112 underlying device dies 102, and top-side RDLs 116 overlying device dies 102. Bottom-side RDLs 112 are formed in dielectric layers 114, and top-side RDLs 116 are formed in dielectric layers 118. RDLs 112 and 116 may be formed of copper, aluminum, nickel, alloys thereof, or multi-layers thereof. In some embodiments, dielectric layers 114 and 118 are formed of inorganic material such as silicon oxide, silicon nitride, silicon oxynitride, or the like. In alternative embodiments, dielectric layers 114 and 118 are formed of organic materials such as polymers, which may further include polybenzoxazole (PBO), benzocyclobutene (BCB), polyimide, or the like.

Through-Vias 122 are formed to penetrate through molding material 120. In some embodiments, through-vias 122 have top surfaces level with the top surface of molding material 120, and bottom surfaces level with the bottom surface of molding material 120. Through-Vias 122 electrically connect bottom-side RDLs 112 to top-side RDLs 116. Through-Vias 122 may also be in physical contact with bottom-side RDLs 112 and top-side RDLs 116.

Electrical connectors 124, which are formed of a non-solder metallic material(s), are formed at the bottom surface of bottom package 100. In some embodiments, electrical connectors 124 are metal pads. In alternative embodiments, electrical connectors 124 include metal pillars such as copper pillars. Throughout the description, electrical connectors 124 are referred to as metal pads 124, although they may have other forms. In accordance with some embodiments, metal pads 124 comprise copper, aluminum, nickel, palladium, gold, or multi-layers thereof. In some embodiments, as shown in FIG. 1, the bottom surfaces of metal pads 124 are level with the bottom surface of the bottom dielectric layer 114. In alternative embodiments, the bottom surfaces of metal pads 124 extend below the bottom surface of the bottom dielectric layer 114. Solder regions 126 are attached to the bottom surfaces of metal pads 124, and bond bottom package 100 to package component 300. In some embodiments, package component 300 comprises a Printed Circuit Board (PCB).

In some embodiments, top package 200 includes package substrate 202, and device die 204 bonded to package substrate 202. The bonding of device die 204 to package substrate 202 may be achieved through wire bonding, flip-chip bonding, or the like. Solder regions 206 bond top package 200 to bottom package 100, wherein solder regions 206 may be in contact with top-side RDLs 116.

Figure 2:
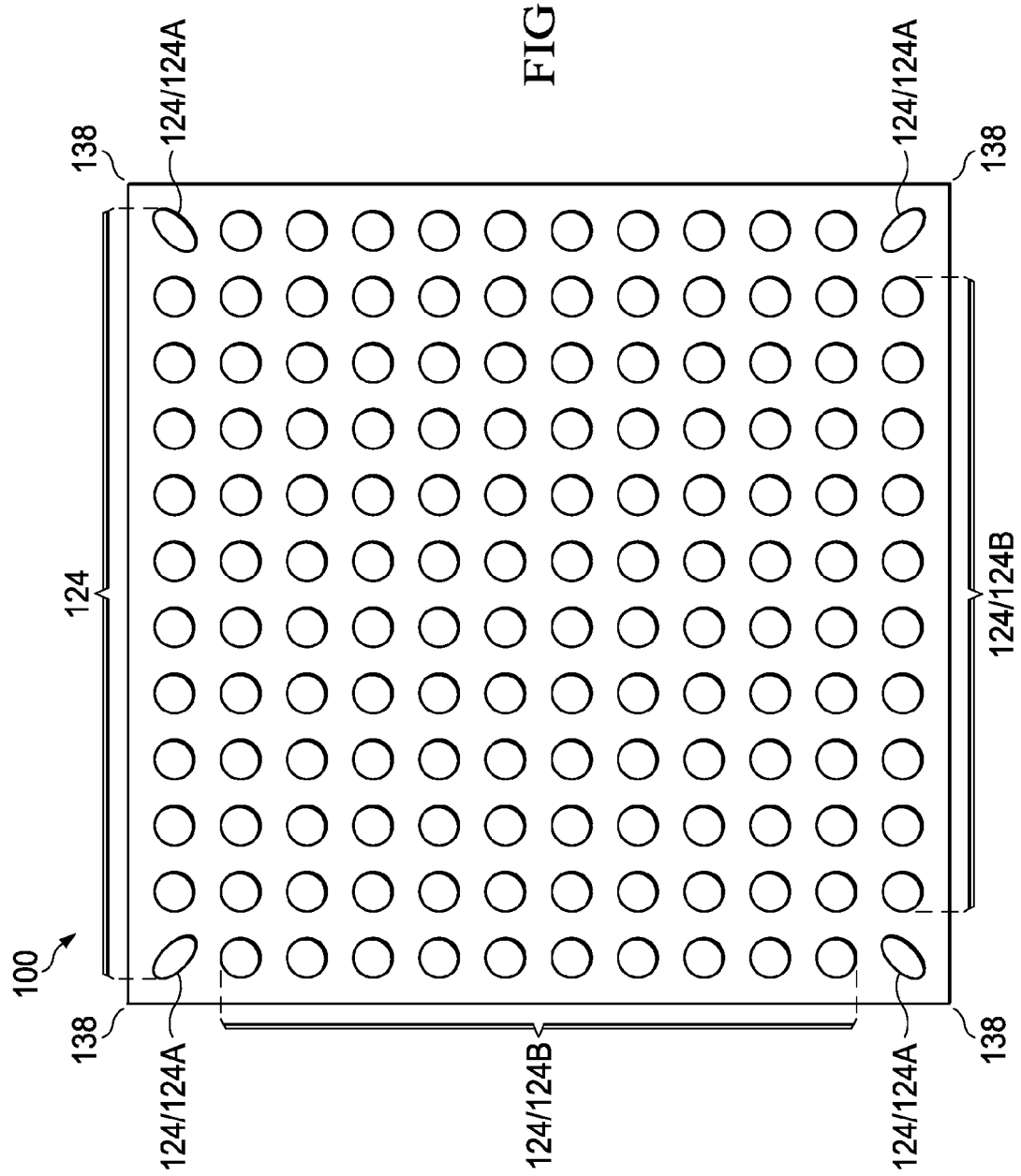
FIG. 2 illustrates a bottom view of a package and non-solder electrical connectors of the package in accordance with some embodiments, wherein corner electrical connectors are elongated connectors.
Figure 9A:
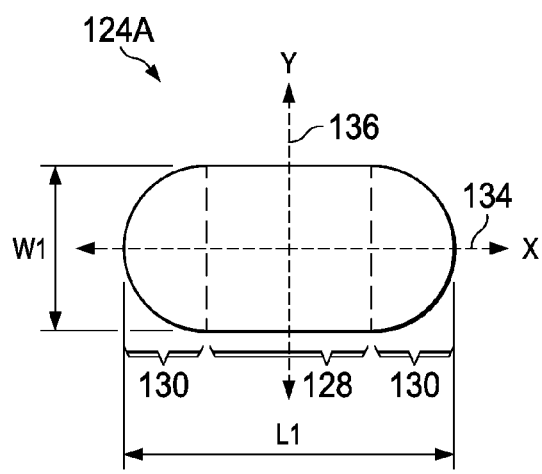
FIGS. 9A and 9B illustrate bottom views of some exemplary elongated electrical connectors.
Figure 9B:
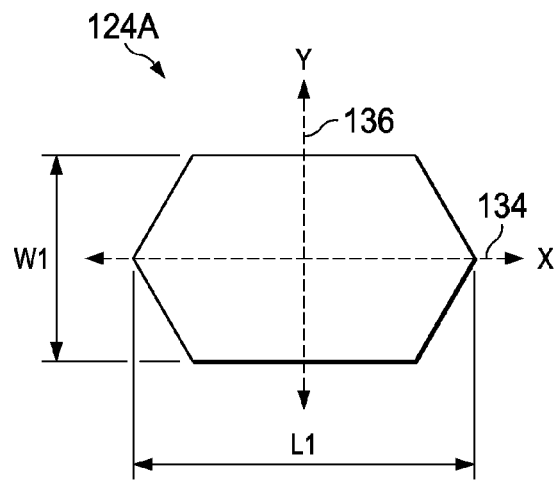

FIG. 2 illustrates a bottom view of bottom package 100, wherein metal pads 124 are illustrated. Metal pads 124 include elongated metal pads 124A and non-elongated metal pads 124B. In FIGS. 2 through 8, circles are used to schematically represent non-elongated metal pads 124B, and ovals are used to schematically represent elongated metal pads 124A. FIGS. 9A and 9B illustrate a bottom view (or a top view) of some exemplary elongated metal pad 124A. Elongated metal pad 124A has length L1 measured in lengthwise direction X, and width W1 measured in widthwise direction Y, which is perpendicular to lengthwise direction X. Length L1 is greater than width W1. Elongated metal pad 124A includes longer axis 134 in lengthwise direction X, and shorter axis 136 in widthwise direction Y. Throughout the description, an elongated metal pad 124A is a metal pad whose length-to-width ratio L1/W1 is greater than a threshold ratio Lt that is greater than 1. Threshold ratio Lt may be greater than about 1.2, greater than about 1.6, or greater than about 2.0.

Elongated metal pad 124A may have various shapes including, and not limited to, an oval shape, a rectangular shape, an elongated octagon shape, or the like. For example, FIG. 9A illustrates an exemplary elongated metal pad 124A, which includes two half circles 130 connected to opposite edges of rectangle 128. FIG. 9B illustrates an elongated hexagon.

Figure 10A:
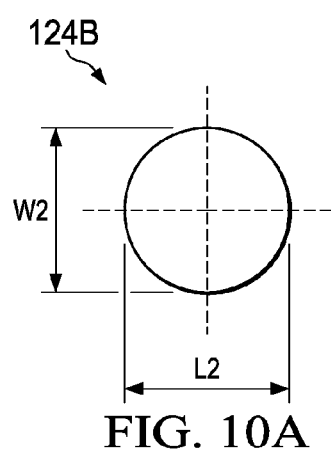
FIGS. 10A and 10B illustrate bottom views of some exemplary non-elongated electrical connectors.
Figure 10B:
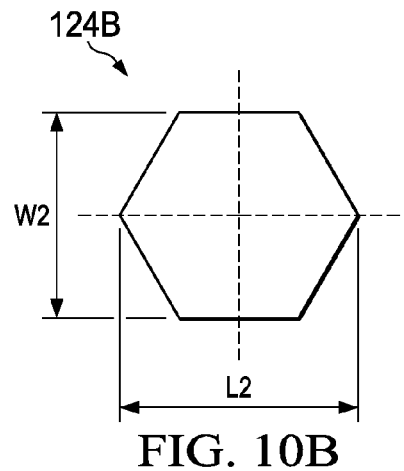

FIGS. 10A and 10B illustrate the bottom views (or top views) of exemplary non-elongated metal pads 124B. Throughout the description, a non-elongated metal pad 124B does not have length L2 and width W2 observably different from each other. Alternatively, a non-elongated metal pad 124B has width W2 smaller than length L2, with length-to-width ratio L2/W2 being smaller than the threshold ratio Lt. For example, FIGS. 10A and 10B illustrate non-elongated metal pads 124B, which have a circular bottom-view shape and a hexagon bottom-view shape, respectively.

Although not shown in FIGS. 9A, 9B, 10A, and 10B, the bottom views of solder regions 126 (FIG. 1) are defined by, and may be the same as, the bottom-view shapes of the respective overlying metal pads 124. Hence, solder regions 126 may also include elongated solder regions and non-elongated solder regions.

Referring back to FIG. 2, bottom package 100 includes four corners 138. The corner metal pads 124, which are closer to the respective corners 138 than all other metal pads, are elongated metal pads 124A. Other metal pads 124 that are farther away from the respective corners 138 than the corner metal pads 124A are non-elongated metal pads 124B. In some embodiments, there may be more than one elongated metal pad 124A at each corner 138. For example, as shown in FIG. 3, there are three elongated metal pads 124A at each corner 138.

Figure 3:
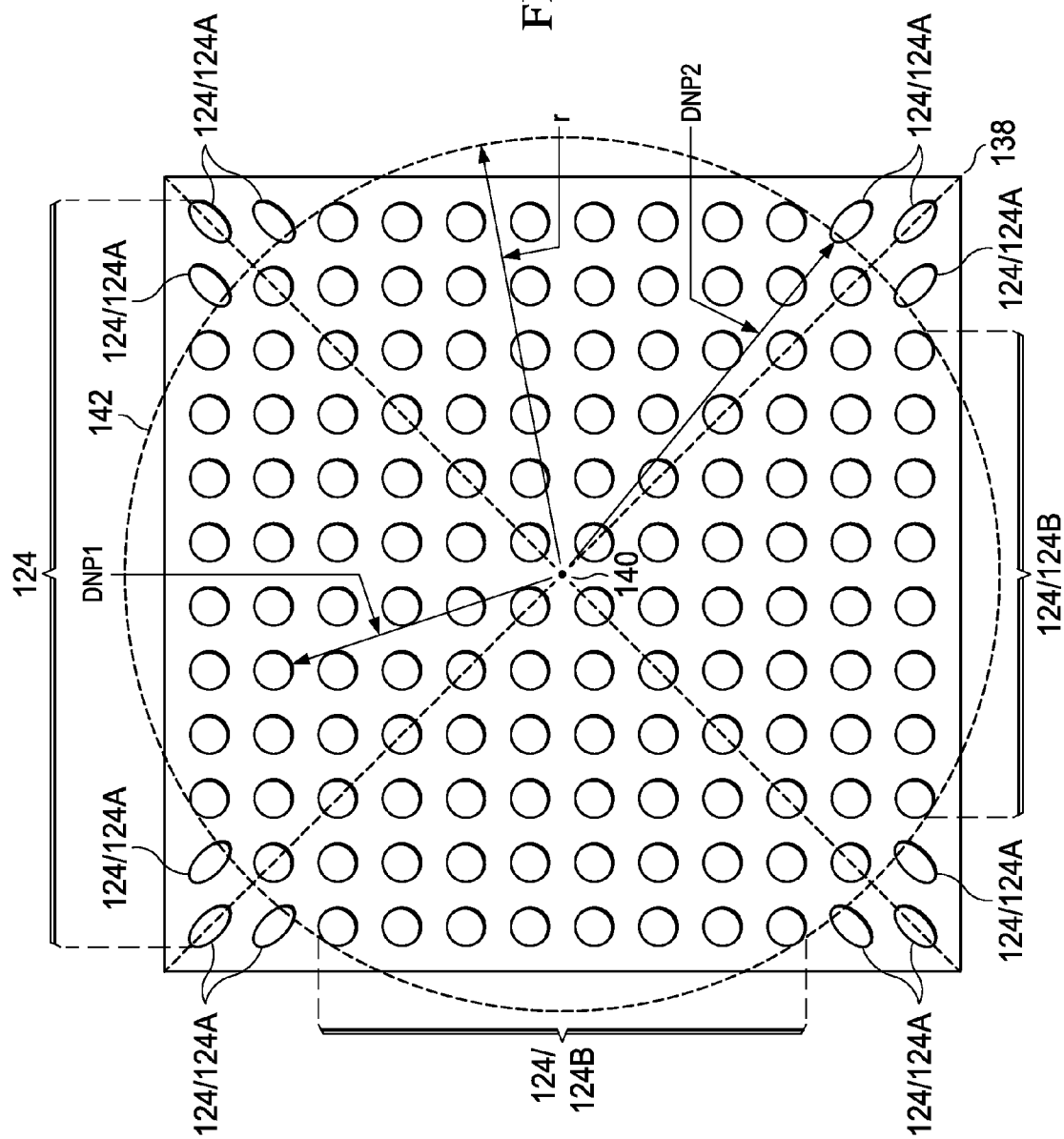
FIG. 3 illustrates a bottom view of a package and non-solder electrical connectors of the package in accordance with some embodiments, wherein a plurality of elongated electrical connectors is distributed to each corner.
Figure 4:
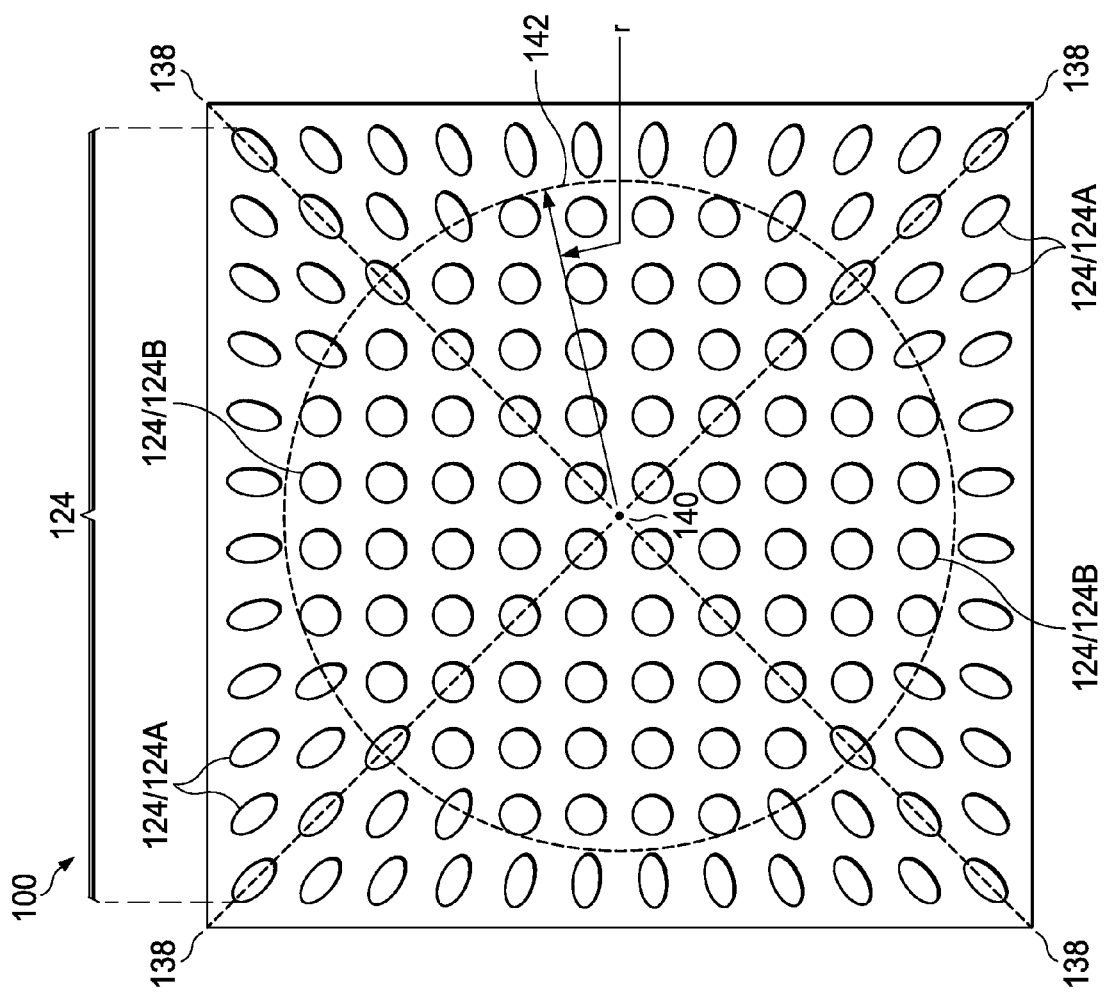
FIG. 4 illustrates a bottom view of a package and non-solder electrical connectors of the package in accordance with some embodiments, wherein elongated electrical connectors and non-elongated electrical connectors are distributed depending on their distances to a neutral-stress point of the package.

FIGS. 3 and 4 illustrate the bottom view of bottom package 100 and metal pads 124 in accordance with alternative embodiments. In the bottom view, bottom package 100 has neutral-stress point 140, which is the point that is substantially free from stresses from all lateral directions that are parallel to the bottom surface of package 100. At neutral-stress point 140, the lateral stresses from opposite directions are cancelled out. In some embodiments, neutral-stress point 140 is at or close to the center of bottom package 100 (in the bottom view). The distance of each of metal pads 124 to neutral-stress point 140 is referred to as a Distance to Neutral Point (DNP) of the respective metal pad, wherein the distance of the metal pad is measured from a point of the metal pad that is closest to neutral-stress point 140. For example, DNPs DNP1 and DNP2 are illustrated as examples in FIG. 3.

A circle 142 is drawn with the neutral-stress point 140 as the center, wherein circle 142 has radius r. In accordance with the embodiments of the present disclosure, all metal pads 124 with DNPs equal to or smaller than radius r are designed as non-elongated metal pads 124B, and all metal pads 124 with DNPs greater than radius r are designed to be elongated metal pads 124A. As illustrated in FIG. 3, if radius r is large, then the elongated metal pads include corner metal pads. In these embodiments, each row includes at least one (or more) metal pad that is the non-elongated metal pad. In FIG. 4, radius r is reduced, and hence an entire edge-row or edge-column of metal pads 124 whose DNPs are greater than radius r are elongated, while the metal pads 124 with the DNPs equal to or smaller than radius r are non-elongated. In the embodiments in FIGS. 3 and 4, the elongated metal pads 124A include corner pads.

Figure 5:
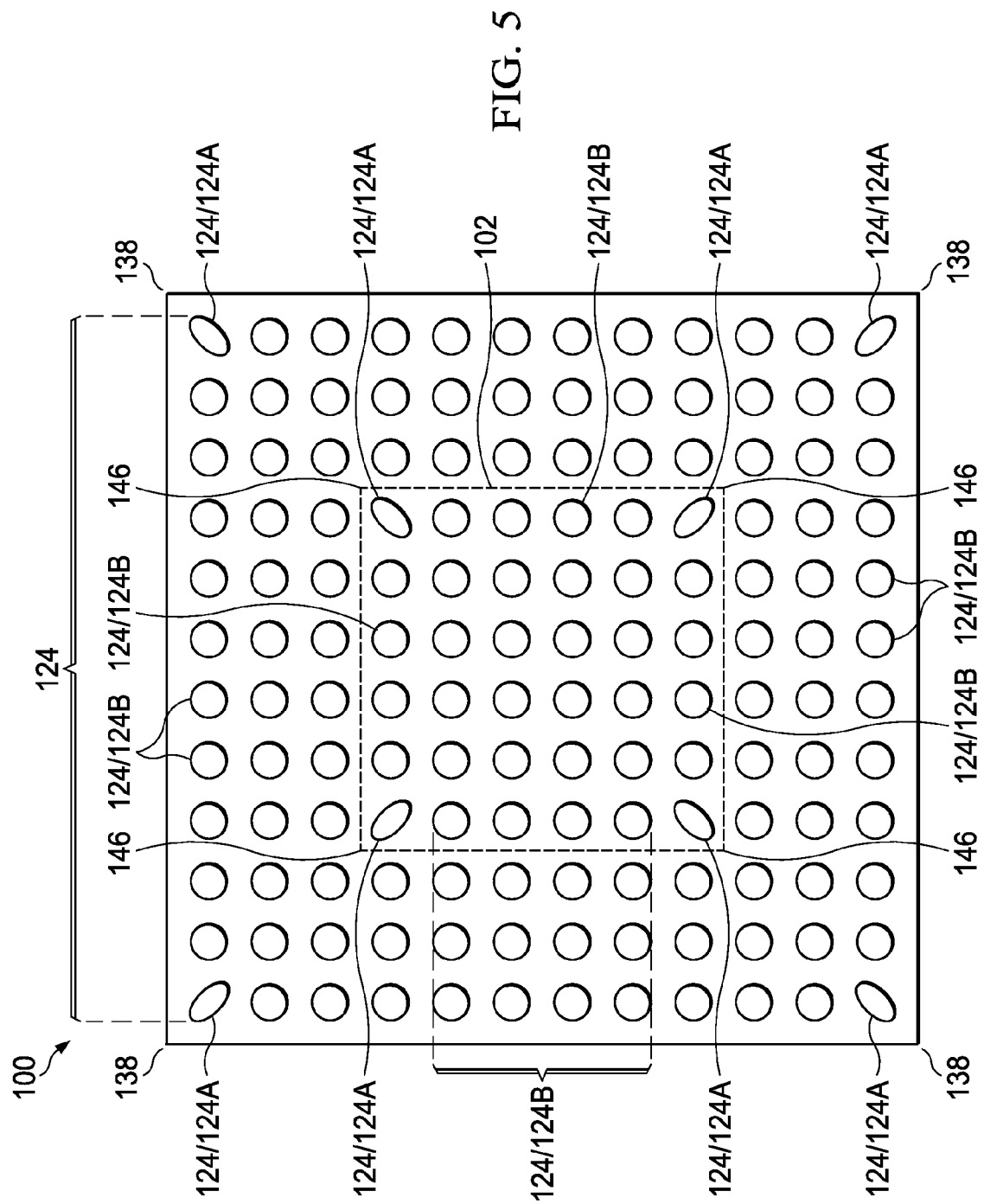
FIG. 5 illustrates a bottom view of a package and non-solder electrical connectors of the package in accordance with some embodiments, wherein inner electrical connectors adjacent to the corners of an overlying device die are elongated.

FIG. 5 illustrates the bottom view of bottom package 100 and metal pads 124 in accordance with yet alternative embodiments. Device die 102 is illustrated in the bottom view. Device die 102 includes corners 146. In some embodiments, the inner metal pads 124 (which are not edge pads and not corner pad) that are overlapped by device die 102, which inner pads 124 are also closest to corners 146, are elongated metal pads 124A, while other metal pads 124 (except the metal pads 124A discussed in the embodiments in FIGS. 2 through 4) are non-elongated metal pads 124B. In some embodiments, the inner elongated metal pads 124A are surrounded by non-elongated metal pads 124B.

Figure 6:
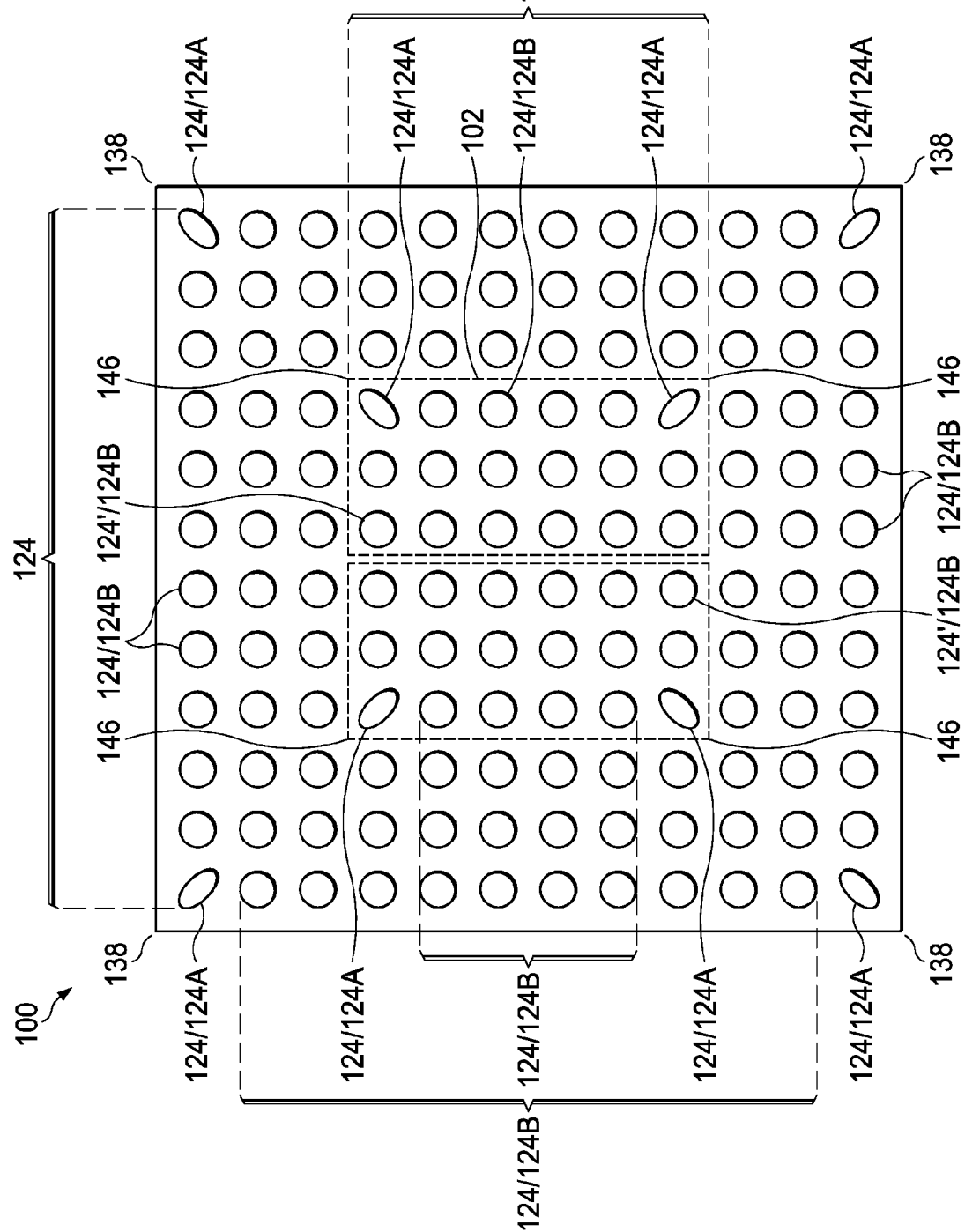
FIG. 6 illustrates a bottom view of a package and non-solder electrical connectors of the package in accordance with some embodiments, wherein inner electrical connectors adjacent to the corners of an overlying device die group are elongated.

FIG. 6 illustrates the bottom view of bottom package 100 and metal pads 124 in accordance with yet alternative embodiments. In these embodiments, a plurality of device dies 102 is closely located from each other to form device die group 148. Device die group 148 includes corners 146. In some embodiments, the inner metal pads 124 that are overlapped by device die group 148, which metal pads 124 are also closest to corners 146, are elongated metal pads 124A, while other metal pads 124 (except the metal pads 124A discussed in the embodiments in FIGS. 2 through 4) are non-elongated metal pads 124B. In some embodiments, the inner elongated metal pads 124A are surrounded by non-elongated metal pads 124B. In these embodiments, some metal pads 124 (marked as 124') that are close to the corners of devices dies 102, but are not close to the corners 146 of device die group 148, may be non-elongated metal pads 124B.

FIGS. 7 and 8 illustrate the bottom views of bottom package 100 and metal pads 124 in accordance with yet alternative embodiments. These embodiments are similar to the embodiments in FIGS. 6 and 7, except that more metal pads 124 that are close to the corners of device dies 102 or device die group 148 are elongated metal pads 124A, which are surrounded by non-elongated metal pads 124B. FIG. 7 illustrates a single device die 102, with elongated metal pads 124A being distributed close to the corners 146 of device die 102. FIG. 8 illustrates a device die group 148, with elongated metal pads 124A being distributed close to the corners 146 of device die group 148. In accordance with some embodiments in FIGS. 5 through 8, an inner elongated metal pad 124A may be fully, or partially, overlapped by the overlying device die 102 or device die group 148.

Throughout the embodiments of the present disclosure, as shown in FIGS. 2 through 8, elongated metal pads 124A are centripetal. This means that the longer axis (FIGS. 9A and 9B) of elongated metal pads 124A extend toward the neutral-stress point 140, which may be, or at least close to, the center of bottom package 100 (in the bottom view). Alternatively stated, the longer axis 134 (FIGS. 9A and 9B) passes through the center of bottom package 100, or at least, the longer axis 134 is closer to the center of bottom package 100 than the shorter axis 136.

The embodiments of the present disclosure have some advantageous features. Simulation results indicated that when the corner metal pads of the bottom package 100 are centripetal elongated metal pads, the respective package fails after 769 thermal cycles in the reliability test. As a comparison, when the corner metal pads of the bottom package 100 are non-elongated metal pads, the respective package fails after 604 thermal cycles. When the corner metal pads of the bottom package 100 are elongated metal pads with the widthwise directions extending toward the neutral-stress point, the respective bottom package fails after 574 thermal cycles. These results indicate that the package with the centripetal elongated metal pads have improved reliability.

In accordance with some embodiments of the present disclosure, a package includes a corner, a device die, a plurality of redistribution lines underlying the device die, and a plurality of non-solder electrical connectors underlying and electrically coupled to the plurality of redistribution lines. The plurality of non-solder electrical connectors includes a corner electrical connector. The corner electrical connector is elongated. An electrical connector is farther away from the corner than the corner electrical connector, wherein the electrical connector is non-elongated.

In accordance with alternative embodiments of the present disclosure, a package includes at least one first dielectric layer, a first plurality of redistribution lines in the at least one first dielectric layer, a device die over and electrically coupled to the first plurality of redistribution lines, a molding material molding the device die therein, and a through-via penetrating through the molding material. At least one second dielectric layer is over the device die. A second plurality of redistribution lines is in the at least one second dielectric layer, wherein the second plurality of redistribution lines is electrically coupled to the first plurality of redistribution lines through the through-via. A plurality of metal pads is underlying the device die and electrically coupled to the second plurality of redistribution lines. The plurality of metal pads includes a first elongated metal pad and a non-elongated metal pad.

In accordance with yet alternative embodiments of the present disclosure, a package includes a plurality of dielectric layers, a plurality of redistribution lines in the plurality of dielectric layers, a device die over and electrically coupled to the plurality of redistribution lines, and a plurality of non-solder electrical connectors underlying and electrically coupled to the plurality of redistribution lines. The plurality of non-solder electrical connectors includes a corner electrical connector and an inner electrical connector. The corner electrical connector and the inner electrical connector are elongated, and are centripetal. A plurality of non-elongated electrical connectors surrounds the inner electrical connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package comprising:
   a bottom package comprising:
      a corner;
      a first device die;
      a plurality of redistribution lines underlying the first device die;
      a plurality of non-solder electrical connectors underlying and electrically coupled to the plurality of redistribution lines, wherein the plurality of non-solder electrical connectors comprises:

a corner electrical connector, wherein the corner electrical connector is elongated; and an electrical connector farther away from the corner than the corner electrical connector, wherein the electrical connector is non-elongated; and a dielectric layer, with the plurality of non-solder electrical connectors in the dielectric layer; and a solder region forming an elongated interface with the corner electrical connector, wherein the elongated interface is coplanar with a bottom surface of the dielectric layer.

2. The package of claim 1, wherein at each of corners of the bottom package, there is an elongated one of the plurality of non-solder electrical connectors.

3. The package of claim 1, wherein the plurality of non-solder electrical connectors comprises an inner elongated connector adjacent to a corner of the first device die, and wherein the plurality of non-solder electrical connectors further comprises a plurality of additional non-elongate connectors surrounding the inner elongated connector, wherein all non-solder electrical connectors immediately neighboring the inner elongated connector are elongated.

4. The package of claim 1 further comprising a second device die over and bonded to the plurality of redistribution lines, wherein the first device die and the second device die are in a die group, wherein the plurality of non-solder electrical connectors comprises inner elongated connectors adjacent to all corners of the die group, and wherein the inner elongated connectors are surrounded by non-elongated connectors among the plurality of non-solder electrical connectors.

5. The package of claim 1, wherein the bottom package has a neutral-stress point in a bottom view of the bottom package, wherein all connectors in the plurality of non-solder electrical connectors and having Distances to Neutral Point (DNPs) greater than a radius are elongated, and wherein all connectors in the plurality of non-solder electrical connectors and having DNPs equal to or smaller than the radius are non-elongated.

6. The package of claim 1, wherein the elongated interface is centripetal.

7. The package of claim 1 further comprising a top package over and bonded to the bottom package.

8. A package comprising:
at least one first dielectric layer;
a first plurality of redistribution lines in the at least one first dielectric layer;
a device die over and electrically coupled to the first plurality of redistribution lines;
a molding material molding the device die therein;
a through-via penetrating through the molding material;
at least one second dielectric layer over the device die;
a second plurality of redistribution lines in the at least one second dielectric layer, wherein the second plurality of redistribution lines is electrically coupled to the first plurality of redistribution lines through the through-via;
a plurality of metal pads underlying the device die and electrically coupled to the second plurality of redistribution lines, wherein the plurality of metal pads comprises a first elongated metal pad and a non-elongated metal pad, and the plurality of metal pads is non-solder metal pads; and
a bottom dielectric layer in the at least one first dielectric layer, with the plurality of metal pads being in the bottom dielectric layer, wherein a bottom surface of the first elongated metal pad is planar and coplanar with a bottom surface of the bottom dielectric layer, and the bottom surface of the first elongated metal pad is elongate and centripetal.

9. The package of claim 8, wherein the first elongated metal pad is a corner metal pad.

10. The package of claim 8, wherein all corner metal pads in the plurality of metal pads are elongated.

11. The package of claim 8, wherein the first elongated metal pad is centripetal, with a lengthwise direction of the first elongated metal pad extending toward a center of the package.

12. The package of claim 8 further comprising a second elongated metal pad, wherein the second elongated metal pad is adjacent to a corner of the device die in a bottom view of the package, wherein at least a portion of the second elongated metal pad is overlapped by a portion of the device die.

13. The package of claim 12, wherein the second elongated metal pad is fully sounded by non-elongated metal pads, wherein all metal pads immediately neighboring the second elongated metal pad are non-elongated.

14. The package of claim 8 further comprising:
a plurality of solder regions adjoined to the plurality of metal pads; and
a Printed Circuit Board (PCB) bonded to the package through the plurality of solder regions.

15. A package comprising:
a plurality of dielectric layers;
a plurality of redistribution lines in the plurality of dielectric layers;
a first device die over and electrically coupled to the plurality of redistribution lines;
a plurality of non-solder electrical connectors underlying and electrically coupled to the plurality of redistribution lines, wherein the plurality of non-solder electrical connectors comprises:
a corner electrical connector, wherein the corner electrical connector is elongated;
a first inner electrical connector, wherein the first inner electrical connector is elongated; and
a plurality of non-elongated electrical connectors surrounding the first inner electrical connector, wherein non-solder electrical connectors immediate neighboring the first inner electrical connector are non-elongated.

16. The package of claim 15, wherein the all non-solder electrical connectors immediately neighboring the first inner electrical connector comprises:
a first electrical connector and a second electrical connector, wherein the first electrical connector, the second electrical connector, and the first inner electrical connector are aligned to a first straight line; and
a third electrical connector and a fourth electrical connector, wherein the third electrical connector, the fourth electrical connector, and the first inner electrical connector are aligned to a second straight line perpendicular to the first straight line, and wherein no additional electrical connector separates the first inner electrical connector from the first, the second, the third, and the fourth electrical connectors.

17. The package of claim 15, wherein the first inner electrical connector comprises a portion overlapped by at least a part of the first device die.

18. The package of claim 15 further comprising a second device die over and electrically coupled to the plurality of redistribution lines, wherein the first device die and the second device die are in a die group, and wherein each of corners of the die group is adjacent to an elongated connector that is among the plurality of non-solder electrical connectors.

19. The package of claim 15 further comprising:
a dielectric layer, with the plurality of non-solder electrical connectors being in the dielectric layer; and
a solder region forming a planar oval interface with the first inner electrical connector, wherein the planar oval interface is coplanar with an outer surface of the dielectric layer.

20. The package of claim 15, wherein length-to-width ratios of the corner electrical connector and the first inner electrical connector are higher than about 1.2.

* * * * *